United States Patent [19]
Gaglani

[11] Patent Number: 5,917,734
[45] Date of Patent: Jun. 29, 1999

[54] PARALLEL DECIMATOR METHOD AND APPARATUS

[75] Inventor: Pranay Gaglani, Austin, Tex.

[73] Assignee: Advanced Micro Device Inc., Sunnyvale, Calif.

[21] Appl. No.: 08/710,321

[22] Filed: Sep. 24, 1996

[51] Int. Cl.[6] .............................. G06F 17/17; G06F 7/38; G06G 7/02
[52] U.S. Cl. ................... 364/724.1; 364/736.01; 364/768; 364/724.011; 364/723; 364/825
[58] Field of Search .............. 364/724.011, 724.1, 364/723, 736.1, 768, 825

[56] References Cited

U.S. PATENT DOCUMENTS

| | | | |
|---|---|---|---|
| 4,302,631 | 11/1981 | Shenoi et al. | 364/724 |
| 4,547,862 | 10/1985 | McIver et al. | 364/726 |
| 4,796,004 | 1/1989 | Rich et al. | 364/724.1 |
| 4,937,577 | 6/1990 | Rich et al. | 364/724.1 |
| 5,191,547 | 3/1993 | Kawamoto et al. | 364/724.1 |
| 5,262,970 | 11/1993 | Sevenhans et al. | 364/724.1 |
| 5,305,007 | 4/1994 | Orr et al. | 342/20 |
| 5,450,083 | 9/1995 | Brewer | 364/724.1 |
| 5,590,065 | 12/1996 | Lin | 364/724.1 |
| 5,751,615 | 5/1998 | Brown | 364/724.1 |
| 5,757,867 | 5/1998 | Caulfield et al. | 364/724.1 |

FOREIGN PATENT DOCUMENTS

| | | | |
|---|---|---|---|
| 162337 | 12/1993 | Japan | H04B 1/707 |
| 7162337 | 12/1993 | Japan . | |

OTHER PUBLICATIONS

Karema et al, "A Filter Processor for Interpolation and Decimation", Proceedings of the Custom Integ. Circuits Conf., May 3–6, 1992, pp. 19–2.1–19.2.4.

*Primary Examiner*—William Grant
*Assistant Examiner*—Navin Natnithithadha
*Attorney, Agent, or Firm*—Foley & Lardner

[57] ABSTRACT

A decimation device has a sampler, a memory and an adder in the decimation stage. The sampler and the adder from a partial sample for storage in the memory at a sample time. At a next sample time the sum of a current sample and the partial sample is output from the decimation stage. The partial sample is formed by adding the first sample to a value equal to twice a second sample obtained after the first sample.

5 Claims, 9 Drawing Sheets

FIG. 4

| | | 4Mhz | 2Mhz | 1Mhz | 512Khz | 256Khz | 128Khz | 64Khz | 32Khz |
|---|---|---|---|---|---|---|---|---|---|

Stage 1: ooooooooooooooooooooooooooooooooo

Stage 2: o o o o o o o o o o o o o o o o

Stage 3: o o o o o o o o

Stage 4: o o o o

Stage 5:

Stage 6:

So On...

- - - - - - - - - - - - - - - - - - - - - - - -

Stage 7: ooooooooooooooo o o o o o

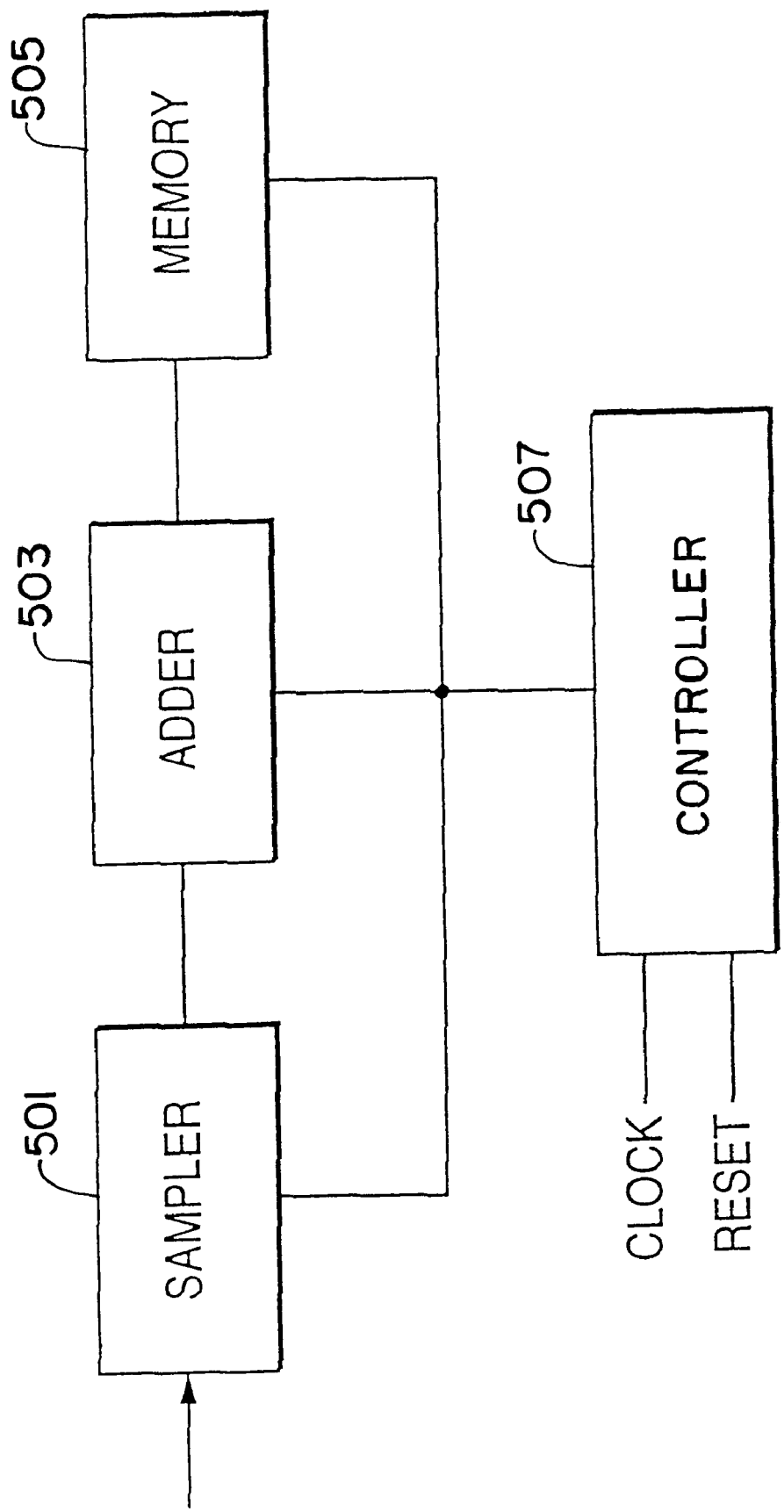

FIG. 7A

```
Accept sample_4Mhz_A        (s4M_A)         LD4MA
Accept sample_4Mhz_B        (s4M_B)         LD4MB
Add    s4M_A      s4M_B     (s2M_A)         LD2MA
Store  s2M_A                                LD2MA
Accept sample_4Mhz_A        (s4M_A)         LD4MA
Accept sample_4Mhz_B        (s4M_B)         LD4MB
Add    s4M_A      s4M_B     (s2M_B)         LD2MB
(All steps above = SEQ 1) <--------
Add    s2M_A      s2M_B     (s1M-B)         LD2MB
                                            DP2ML_1M
Mult   s1M_B * 2            (s1M_B2)        MUL2_1M
Load   s1M_A                                MUL2_1M
Add    s1M_A      s2M_B2    (ps_512K)       MUL2_1M
Store  ps_512K                              PST_512K
SEQ 1
Add    s2M_A      s2M_B     (s1M_A)         LD2MB
Store  s1M_A                                STO_1M
Load   ps_512K                              LATCH_1M
(All steps above = SEQ 2) <------
Add    ps_512K    s1M_A     (s512K_B)       LATCH_1M
                                            DP2ML_512K
Mult   s512K_B * 2          (s512K_B2)      MUL2_512K
Load   s512K_A                              MUL2_512K
Add    s512K_A    s512K_B2  (ps_256K)       MUL2_512K
Store  ps_256K                              PST_256K
SEQ 2
Add    ps_512K    s1M_A     (s512K_A)       LATCH_1M
Store  s512K_A                              STO_512K
Load   ps_256K                              LATCH_512K
(All steps above = SEQ 3) <-----
Add    ps_256K    s512K_A   (s256K_B)       LATCH_512k
                                            DP2ML_256k
Mult   s256K_B * 2          (s256_B2)       MUL2_256K
Load   s256K_A                              MUL2_256K
Add    s256K_A    s256K_B2  (ps_128K)       MUL2_256K
Store  ps_128K                              PST_128K
SEQ 3
Add    ps_256K    s512K_A   (s256K_A)       LATCH_512K
```

FIG. 7B

```
Store  s256K_A                                    STO_256K
Load   ps_128K                                    LATCH_256k
(All steps above = SEQ 4)  <-----
Add    ps_128K    s256K_A    (s128K_B)            LATCH_256k
                                                  DP2ml_128k Mult   s128K_B  * 2          (s128K_B)            MUL2_128K
Load   s128K_A                                    MUL2_128K
Add    s128K_A    s128K_B2   (ps_64K)             MUL2_128K
Store  ps_64K                                     PST_64K
SEQ 4
Add    ps_128K    s256K_A    (s128K_A)            LATCH_256K
Store  s128K_A                                    STO_128K
Load   ps_64K                                     LATCH_128k
(All steps above = SEQ 5)  <-----
Add    ps_64K     s128K_A    (s64K_B)             LATCH_128K
                                                  DP2MUL_64K Mult   s64K_B   * 2          (s64K_B)             MUL2_64K
Load   s64K_A                                     MUL2_64K
Add    s64K_A     s64K_B2    (ps_32K)             MUL2_64K
Store  ps_32K                                     PST_32K
SEQ 5
Add    ps_64K     s128k_A    (s64K_A)             LATCH_128K
Store  s64K_A                                     STO_64K
Load   ps_32K                                     LATCH_64K
Add    ps_32K     s64K_A     (s32K)               LATCH_64K
```

PARALLEL DECIMATOR METHOD AND APPARATUS

BACKGROUND OF THE INVENTION

1. Field of the Invention

The invention relates to apparatus and methods for performing decimation.

2. Description of Related Art

Voice processing is a real time issue. Processing voice data requires accepting the data at a very high rate since accepting data at a relative lower rate results in lost information and degraded performance. Moreover, voice data processing itself is often a lengthy task. The acceptance of data at a high rate combined with such long processing tasks often demand the use of parallel execution units operating at very high rates. Such execution units typically consume large amounts of power and significant amounts of silicon area. Therefore, before processing takes place on voice data, such data is often routed to a 'decimator.'

A decimator accepts data at a high rate and generates equivalent information at a relatively low rate, such that data processing can be performed comfortably. 'Decimation' is a process for accumulating information at regular intervals and combining the information such that combined result still represents the original information, but can be processed at a lower rate than the rate at which the original information is available.

A decimator is a demanding logic element. A decimator must accommodate a high rate of incoming data and feed that data to different stages of a decimator apparatus performing various decimator functions. In the past, a serial approach was used to implement the function. Disadvantages of the serial approach include the number of components required, thereby driving up the costs of such devices, and the time delay introduced by serial processing.

SUMMARY OF THE INVENTION

In view of the above mentioned limitations of the related art the invention provides a lower cost decimator. Such a decimator operates at higher speeds than speeds obtained from conventional decimators. A decimator according to the invention requires less silicon area than that required by conventional decimators.

A decimator according to the invention is implemented using structured cells to achieve layout advantages. The invention also provides a decimator which is parallel in nature. Further, the invention provides a decimator which time shares common resources to execute the stages of decimation.

A decimator according to the invention has a decimation stage with a sampler. The sampler and the adder form a partial sample which is stored in a memory. At the next sample time, the current sample and the partial sample are added to form a sum. The sum is the output of the decimation stage. The partial sample discussed above is formed when the memory stores a first sample and the adder adds a value of twice a second sample to the first sample. The sampling, adding and memory storage functions can be implemented by discrete circuitry or in a processor.

According to the invention, a decimator can be implemented by a plurality of controllers causing the sampler, memory and adder to carry out decimation. The controller stages are commonly clocked with each stage receiving as its input, the output of the preceding stage. In one decimator according to the invention five such decimation controller stages are serially connected. The first stage receives as its input the output from two preceding controller stages of a second type. The second type controller causes the addition of the current sample to the previous sample. Thus, a decimator according to the invention includes two such second type controllers serially connected to each other, the first controller of the second type receiving a clock and announcing to the sampler the presence of samples. The output of the first controller of the second type is routed to another controller of the second type which announces samples to the sampler at one half the previous sample rate. The result of each addition adds another bit of precision.

The output of the second decimation controller of the second type is then routed to the input of the first of five decimation controllers of the first type connected in series. In this way a signal sampled at 4 Mhz to 6 bits can be converted through decimation to a 32 Khz sampled signal of 18 bits.

BRIEF DESCRIPTION OF THE DRAWINGS

The above and other objects of the invention are met by the method and apparatus described herein with reference to the drawings in which:

FIG. 4 is a dot diagram of nanocode control;

FIG. 5 is a block diagram of the processing elements of a system according to the invention;

FIGS. 7A–B are a listing of nanocode showing the sequencing of events and the associate signals in FIG. 6 to trigger execution of the steps discussed above.

DETAILED DESCRIPTION OF THE PREFERRED EMBODIMENTS

Figure 1:
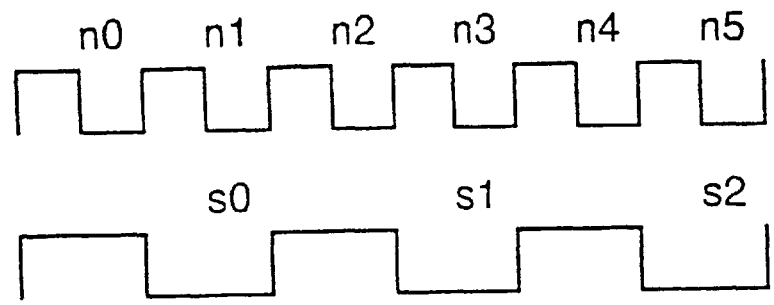
FIG. 1 shows 4 Mhz to 2 Mhz decimation.

The method according to the invention employs a floor plan that is customized to handle decimation. It provides 'visible' outputs that can be observed for every stage of decimation and limits the temporary storage in memory required for intermediate calculations. An execution unit or processor is dedicated to performing decimation. The execution unit processes incoming data and outputs the result on the same cycle of a clock. In order to achieve this result, the execution unit is formed using a parallel processor capable of executing the required functions in a single cycle.

By way of example and not limitation assume that a decimation apparatus according to the invention accepts 4 Mhz input data samples and generates 32 Khz output samples. Such a decimator has the following stages and respective decimation functions:

| clock rate | stage | decimation function |
| --- | --- | --- |
| 4 Mhz | 4 Mhz - 2 Mhz | $(1 + z^{-1})$ |
| 2 Mhz | 2 Mhz - 1 Mhz | $(1 + z^{-1})$ |
| 1 Mhz | 1 Mhz - 512 Khz | $(1 + z^{-1})*(1 + z^{-1})$ |
| 512 Khz | 512 Khz - 256 Khz | $(1 + z^{-1})*(1 + z^{-1})$ |

-continued

| clock rate | stage | decimation function |
|---|---|---|
| 256 Khz | 256 Khz - 128 Khz | $(1 + z^{-1})*(1 + z^{-1})$ |
| 128 Khz | 128 Khz - 64 Khz | $(1 + z^{-1})*(1 + z^{-1})$ |
| 64 Khz | 64 Khz - 32 Khz | $(1 + z^{-1})*(1 + z^{-1})$ |

Altogether in this example, there are seven stages with associated decimation functions. Each stage executes one of the two decimation equations: $(1+z^{-1})$ or $(1+z^{-1})*(1+z^{-1})$.

In a stage implementing the first decimation function $(1+z^{-1})$, the input samples are accepted at the clock rate for that stage. Once a sample arrives, it is added to the previously stored sample. The result of such an addition becomes the output sample of that stage.

In a stage implementing the second decimation function $(1+z^{-1})*(1+z^{-1})$, execution processing can be done in parts. Rewriting $(1+z^{-1})*(1+z^{-1})$ as $(1+2*z^{-1}+z^{-2})$ it is seen that the output of this stage can be obtained by adding the current sample to twice the previous sample and to the sample one before the previous one. Evident from this expression is that two storage elements are required to store the two samples preceding the current sample. However, if the expression is rewritten as:

$$S=1+(2*z^{-1}+z^{-2})$$

or $S=1+P$, where $P=(2*z^{-1}+z^{-2})$, then it is only necessary to store P, the partial sample. Generating the term P, however, implies additional intermediate processing of the data. Thus, implementation of second decimation function $(1+z^{-1})*(1+z^{-1})$ can be split into the following two parts:

1) Generation of partial sample, P.
2) Generation of final sample, S.

By generating the partial sample one sample time unit prior to generating the final sample output, S, at that instant, the partial sample is calculated as $$(2+z^{-1})$$

or 2(current sample)+previous sample. Generation of the final output sample is done when the partial sample output has already been calculated. The final output sample is arrived at by the function $S=1+P$, adding the current sample to the partial sample output. At the time of the final sample S, which is the next sample time, P now represents the sum of twice the previous sample and the sample before the previous sample. Thus, $P=2z^{-1}+z^{-2}$ and $S=1+2z^{-1}+z^{-2}$.

According to the invention, nanocode can be used to execute all seven stages of the example decimator using the same processor or execution unit. Events are scheduled such that all the decimation functions corresponding to the various decimation stages are interleaved and the need for temporary storage is reduced. In this particular decimator, the input samples arrive at the rate of 4 Mhz and the decimator outputs the samples at 32 Khz. The incoming samples are 6-bits wide including the sign bit and the output samples are 18-bits wide including the sign bit. The nanocode for this example decimator is executed on a unit operating at 12 Mhz. The following is a stage by stage explanation of the floor plan.

The first stage according to the example is the decimation of 4 Mhz to 2 Mhz samples. The decimation function is $(1+z^{-1})$. At the rate of 4 Mhz, 6 bit wide input samples are received. The first sample received is stored and the next sample received is added to the stored sample. This addition results in the output sample. Since it takes two 4 Mhz samples to generate one sample, the output rate is 2 Mhz. FIG. 1 shows signals illustrating the process of 4 Mhz to 2 Mhz decimation. In FIG. 1, 4 Mhz samples n0, n1, n2, n3, . . . are input to the decimator. 2 Mhz output samples are generated as s0, s1 . . . , where $$s0=n0+n1, s1=n2+n3$$

A store event during which the sample is stored in memory is scheduled every first 4 Mhz sample. An add event in which the processor adds the current sample to the sample stored in memory is scheduled every second 4 Mhz sample. Since each 2 Mhz output sample is generated by adding two 4 Mhz 6 bit samples, each 2 Mhz sample is 7 bits wide.

Figure 2:
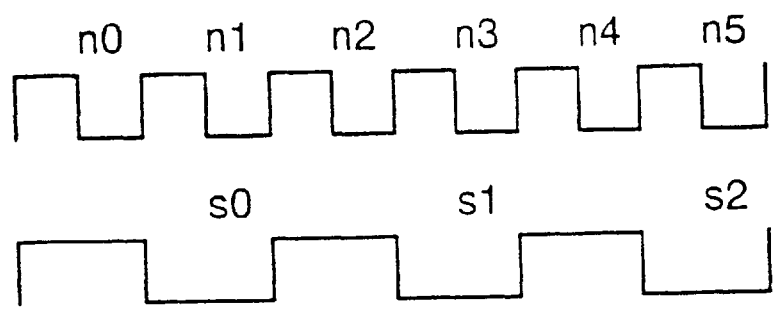
FIG. 2 shows 2 Mhz to 1 Mhz decimation.

The second stage is the decimation of 2 Mhz to 1 Mhz samples. The decimation function again is $(1+z^{-1})$. At the rate of 2 Mhz, 7 bit wide input samples are received. The first sample received is stored and the next sample received is added to the stored sample. This addition results in the output sample. Since it takes two 2 Mhz samples to generate one sample, the output rate is 1 Mhz. FIG. 2 illustrates signals generated the process of 2 Mhz to 1 Mhz decimation. In FIG. 2, 2 Mhz samples n0, n1, n2, n3, . . . are the input to the decimator. 1 Mhz output samples are generated as s0, s1 . . . , where $$s0=n0+n1$$

$$s1=n2+n3$$

A store event is scheduled every first 2 Mhz sample. An add event is scheduled every second 2 Mhz sample. Since each 1 Mhz output sample is generated by adding two 2 Mhz 7 bit samples, each 1 Mhz sample is 8 bits wide.

The third stage is the decimation of 1 Mhz to 512 Khz samples. In this case, the decimation function is $(1+z^{-1})*(1+z^{-1})$. Input samples are accepted from the output of the prior stage. The implementation of $(1+z^{-1})*(1+z^{-1})$ is done in two steps by generating a partial sample, P, and a final sample, S, as previously discussed, wherein:

step 1: $P_{512K}=2+z^{-1}$ step 2: $S_{512K}=1+P_{512K}$

Step 1 generates the partial sample for this stage. To generate the partial sample, the current sample is doubled and then added to the previous sample. Thus, it is necessary to fetch the previously stored sample and to double the current sample before generating the partial sum. The partial sample, $P_{512K}$, is then stored in memory for the later use.

Step 2 generates the final output samples for this stage. The current sample is added to the partial sample $P_{512K}$. A fetch of $P_{512K}$ is scheduled prior to generating the final sample $S_{512K}$.

Figure 3:
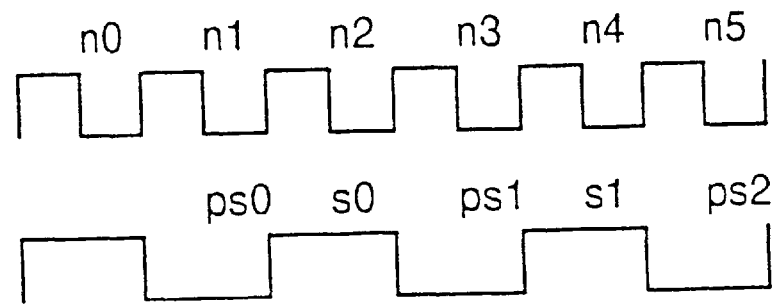
FIG. 3 shows 1 Mhz to 512 Khz decimation.

Since the partial sample $P_{512K}$ is generated by adding two 1 Mhz samples (one 8 bit wide and the other 9 bits wide). The partial sample $P_{512K}$ is 18 bits wide. The final sample $S_{512K}$ output is generated by adding the 8 bit wide 1 Mhz sample and the bit wide partial sample. Therefore, the final stage is 10 bits wide. FIG. 3 illustrates the third decimation stage. In FIG. 3, samples n0, n1, n2, n3, . . . are 1 Mhz samples. Step 1 is implemented by adding samples n0 and 2*n1. This partial sample ps0 is stored in memory. Step 2 is implemented upon arrival of sample n2. Sample n2 is added to ps0 to generate 512 Khz sample s0. The process includes fetching the previously stored sample, multiplying the current sample by 2 and adding it to the previous sample to generate the partial sample. A store of the partial sample follows. Later, upon arrival of yet another 1 Mhz sample, the sample is first stored, and then a fetch of the partial sample is performed. Partial sample $P_{512K}$ is then added to the current 1 Mhz sample to generate final output $S_{512K}$.

Stage 4, 5, 6 and 7 are carried out in a fashion similar to stage 3. They all have the same decimation function. However, the bit length for each of the stages is different, as illustrated below:

Stage 4: Partial sample=12 bits; Final sample=12 bits.

Output rate=256 Khz.

Stage 5: Partial sample=14 bits; Final sample=14 bits.

Output rate=128 Khz.

Stage 6: Partial sample=16 bits; Final sample=16 bits.

Output rate=64 Khz.

Stage 7: Partial sample=18 bits; Final sample=18 bits.

Output rate=32 Khz.

All seven stages combine to form a decimation output at 32 Khz from the incoming samples at 4 Mhz.

For a solution that is performance driven and yet economical, a single execution unit can be used to implement all the stages with a minimum requirement for temporary storage. A program to be executed by the processor or execution unit may include nanocode that orders the sequences of instruction to be executed in an appropriate manner. FIG. 4 is a 'Dot Diagram' illustrating the sample generation in various stages and their interdependence.

Stages 1–4 are illustrated in FIG. 4. Stage 5 follows from stage 4 as the stage 4 follows from stage 3. Similarly, stage 6 follows from stage 5 as stage 5 follows from stage 4. In FIG. 4 the scale is changed at stage 7 to show the generation of 32 Khz samples.

Figure 6A:
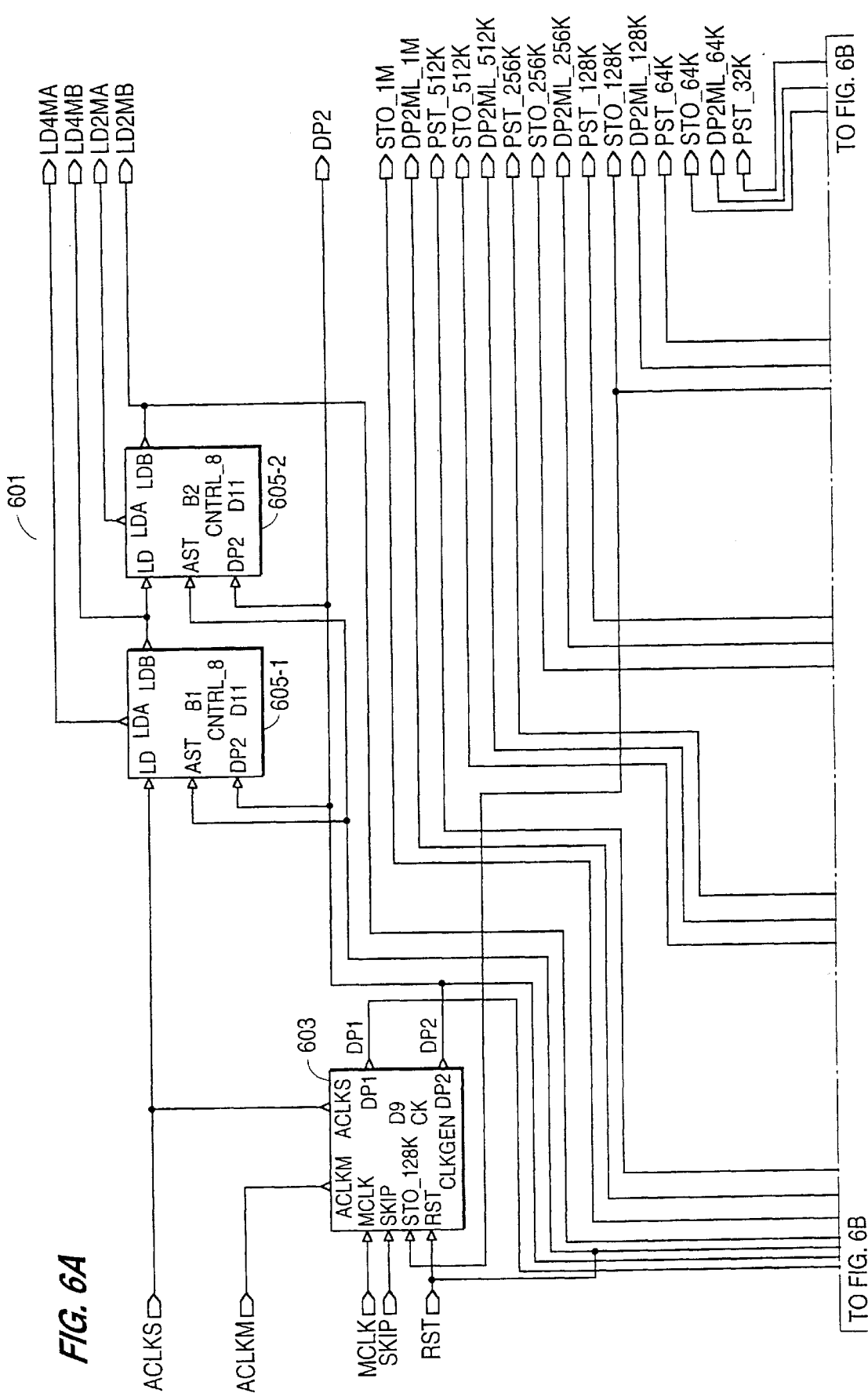
FIG. 6 is a block diagram of a decimation according to the invention.
Figure 6B:
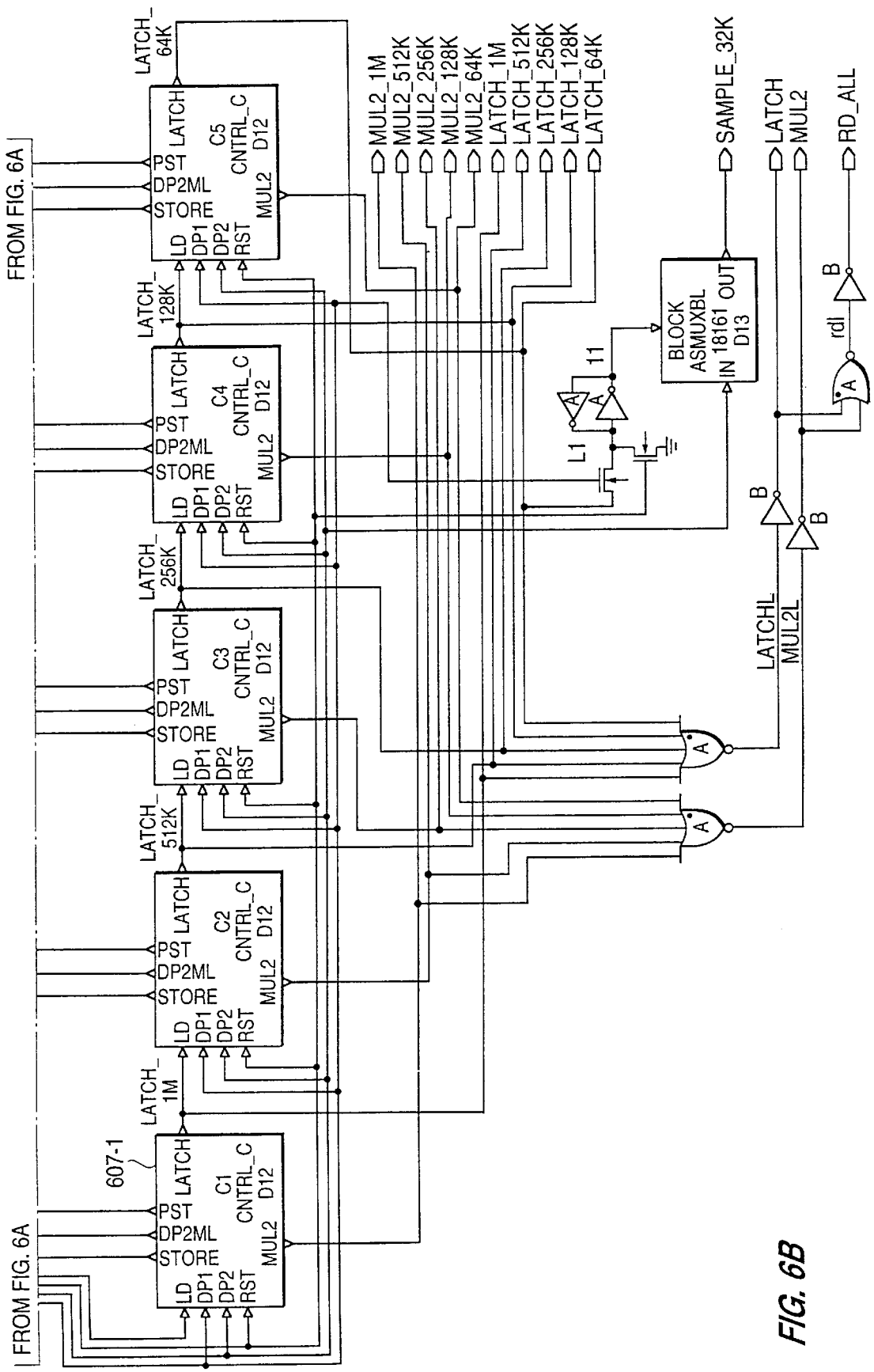

Based upon the dot diagram in FIG. 4, the nanocode is designed to execute the samples as they are generated. The sequencing of the control is completely interleaved to share the same resources. FIG. 5 is a block diagram showing a sampler 501, an adder 503, a memory 505, and a controller 507. Controller 507 is used to schedule execution of the decimation steps and is shown in more detail in FIG. 6. A control unit that schedules the execution of various stages is shown in FIG. 6, generally at 601.

Figure 8:
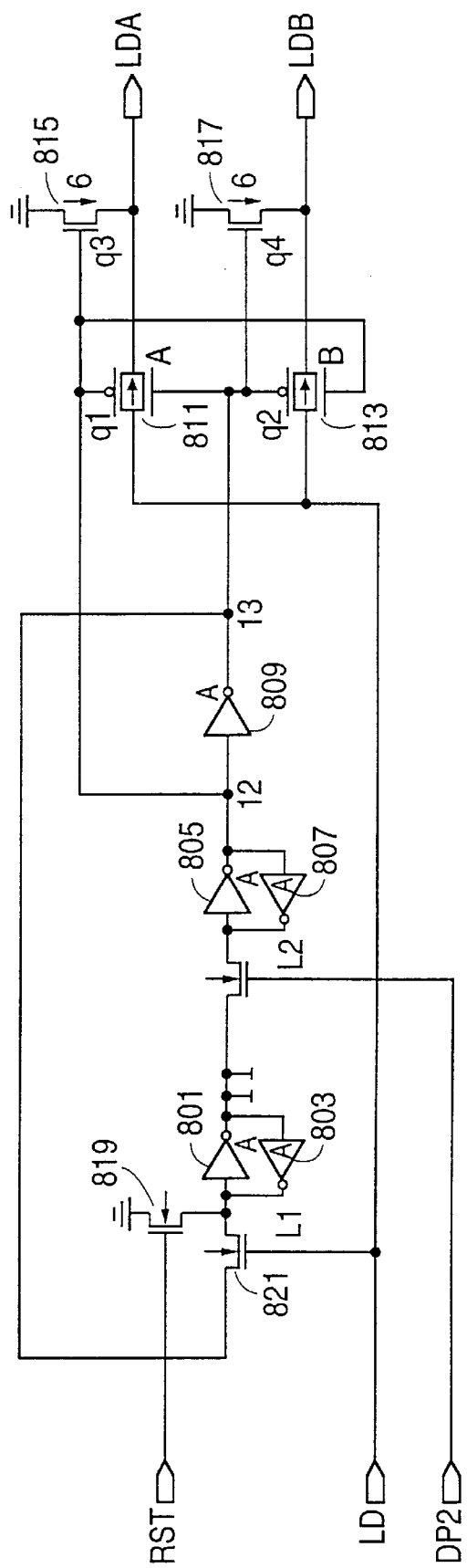
FIG. 8 is a block diagram of one type of decimation controller used in FIG. 6.

A 4 Mhz sample clock ACLKS generated from master clock MCLK in circuit 601 is used to load the samples. Signal LD4MA and LD4MB are generated successively in control circuit 605-1 which receives 4 Mhz sample clock CLKS. Therefore, each of the two signals occur at the rate of 2 Mhz. For every occurrence of LD4MB which is routed to circuit 605-2, either LD2MA or LD2MB are generated. Circuit 605-2 is a duplicate of circuit 605-1, since LD4MB is at a rate of 2 Mhz, the rate of which LD2MA and LD2MB are generated is 1 Mhz. FIG. 8 shows circuit CNTRL-B (605-1, 605-2) and is discussed further herein.

LD2MB declares the presence of samples at 1 Mhz to control circuit 607-1. As the next sample arrives, the sample is multiplied by two and added to the previously stored sample. Before the multiplication occurs, the processor applies a sign extension for overflow correction. This control circuit 507-1 generates signal is signal DP2ML-1M to trigger the program to perform this sign extension function. The very next phase of DP1 causes circuit 607-1 to generate a signal MUL2-1M, which triggers the processor to execute the following steps simultaneously.

(1) Multiply the current sample by 2.

(2) Load the previously stored sample.

(3) Add the current sample multiplied by 2 and the previously stored sample, as determined in (1) and (2) immediately above, to generate partial sample for the next stage.

Signal PST__512K generated on the next phase of DP2 triggers the processor to store the partial sample in a memory. Upon its arrival, the next 1 Mhz sample is first stored by the processor in response to signal STO__1M also generated in circuit 607-1, so that the new sample can be used later. After having been stored, the new sample is added to the previously stored partial sample to generate the 512 Khz sample. This function is performed by the processor in response to signal LATCH__1M generated in circuit 607-1. LATCH__1M triggers the processor to:

(1) Read the partial sample ps__512K, and (2) Add the current 1 Mhz sample to ps__512K.

FIG. 8 shows the circuit CNTRL__C (607-1 through 607-5) which generates these signals and is discussed in more detail further herein.

LATCH__1M generated by control circuit 607-1 also declares the presence of samples at 512 Khz. As the next 512 Khz sample arrives, the sample is multiplied by two and added to a previously stored sample. Before this multiplication occurs, the processor applies a sign extension for overflow correction in response to DP2ML__512K. The very next phase of DP1 causes circuit 607-2 to generate signal MUL2__512K which triggers the processor to execute the following steps simultaneously:

(1) Multiply the current sample by 2.

(2) Load the previously stored sample.

(3) Add the current sample multiplied by 2 and the previously stored sample (from steps 1 and 2 immediately above) to generate the partial sample for the next stage.

Signal PST__256K generated in circuit 607-2 on the next phase of DP2 triggers the processor to store the partial sample. Upon its arrival, the next sample is first stored by the processor in a memory in response to signal STO__512K generated in control circuit 607-2 so that it can be used later. After having been stored, the new sample is added to the previously stored partial sample to generate the 256 Khz sample. This function is performed by the processor in response to signal LATCH__512K generated in circuit 607-2. LATCH__512K triggers the processor 10:

(1) Read the partial sample ps__256K, and (2) Add the current 512 Khz sample to ps__256K.

LATCH__512k generated by control circuit 607-2 also declares the presence of samples at 256 Khz to control circuit 607-3. As the next 256 Khz sample arrives, the sample is multiplied by two and added to the previously stored sample. Before this multiplication occurs, the processor applies a sign extension for overflow correction, in response to signal DP2ML__256K generated by control circuit 607-3. The very next phase of DP1 causes control circuit 607-3 to generate signal MUL2__256K which triggers the processor to execute the following steps simultaneously:

(1) Multiply the current sample by 2, (2) Load the previously stored sample, and (3) Add the current sample multiplied by 2 and the previously stored sample (from steps 1 and 2 immediately above) to generate the partial sample for the next stage.

Signal PST_128K generated in control circuit 607-3 on the next phase of DP2 triggers the processor to store the partial sample. Upon its arrival, the next 256 Khz sample is first stored by the processor in a memory in response to signal STO_256K generated in control circuit 607-3 so that it can be used later. After having been stored, the new sample is added to the previously stored partial sample to generate a 128 Khz sample. This function is performed by the processor in response to LATCH_256K generated in control circuit 607-3. LATCH_256K triggers the processor to:

(1) Read the partial sample ps_128K, and
(2) Add the current 256 Khz sample to ps_128K.

LATCH_256k generated in control circuit 607-3 also declares the presence of samples at 128 Khz. As the next 128 Khz sample arrives, the sample is multiplied by two and added to a previously stored sample. Before the multiplication occurs the processor applies a sign extension for overflow correction in response to signal DP2ML_128K generated by control circuit 607-4. The very next phase of DP1 causes control circuit 607-4 to generate signal MUL2_128K, which triggers the processor to execute the following steps simultaneously:

(1) Multiply the current sample by 2.
(2) Load the previously stored sample.
(3) Add them to generate the partial sample for the next stage.

Signal PST_64K generated by control circuit 607-4 on the next phase of DP-2 triggers the processor to store the partial sample. Upon its arrival, the next 128 Khz sample is first stored by the processor in a memory in response to signal STO_128K generated in control circuit 607-4 so that it can be used later. After having been stored, the sample is added to the previously stored partial sample to generate a 64 Khz sample. This function is performed by the processor in response to signal LATCH_128K generated in circuit 607-4. LATCH_128K triggers the processor to:

(1) Read the partial sample ps_64K, and
(2) Add the current 128 Khz sample to ps_64K.

LATCH_128K generated in control circuit 607-4 also declares the presence of samples at 64 Khz to control circuit 607-5. As the next 64 Khz sample arrives, the sample is multiplied by two and added to the previously stored sample. Before the multiplication occurs, the processor applies a sign extension for overflow correction in response to signal DP2ML_64K generated by control circuit 607-5. The very next phase of DP1 causes control circuit 607-5 to generate signal MUL2_64K, which triggers the processor to execute the following steps simultaneously:

(1) Multiply the current sample by 2,
(2) Load the previously stored sample, and
(3) Add them to generate partial sample for the next stage.

Signal PST_32K generated in control circuit 607-5 on the next phase of DP2 triggers the processor to store the partial sample. Upon its arrival the next 64 Khz sample is first stored by the processor in a memory in response to signal STO_64K generated in control circuit 607-5, so that it can be used later. After having been stored, the new sample is added to the previously stored partial sample to generate a 32 Khz sample. This function is performed by the processor in response to signal LATCH_64K generated in control circuit 607-5. LATCH_64K triggers the processor to:

(1) Read the partial sample ps_32K, and
(2) Add the current 64 Khz sample to ps_32K.

LATCH_64K also declares the presence of samples at 32 Khz. This completes the entire cycle of the nanocode, which accepts 4 Mhz samples to generate 32 Khz output.

FIGS. 7A–B are a listing of nanocode showing the sequencing of events and the associate signals in FIG. 6 to trigger execution of the steps discussed above.

FIG. 8 is a block diagram of a first type of decimation stage used in FIG. 6 and shown as 605-1 and 605-2. The circuit in FIG. 8 implements the $(1+z^{-1})$ decimation function of the first two stages.

DP1 and DP2 are non-overlapping clocks and LD is a conditional DP1 signal. Thus, LD and DP2 are non-overlapping clock signals. RST is an asynchronous reset signal that externally forces LD to 0 and DP2 to 1. The output of each block are signals LDA and LDB. Every LD signal alternatively generates LDA and LDB. Therefore, an LD coming at a rate of 4 Mhz will generate LDA and LDB at 2 Mhz.

Initially, RST will generate the reset action. When RST is set to 1, the reset signal forces DP2 to 1 and LD to 0. This results in node 11=1, node 12=0 and node 13=1. Pass gate 811 will be ON and pass gate 813 will be OFF. Since pass gate 811 is ON, LDA=LD=0. Since pass gate 813 is OFF, nmos gate 817 will be ON, and therefore, LDB=0.

Once the RST is set to 0, signals LD and DP2 assume their normal clock operations. DP2 occurs at every clock cycle, whereas LD occurs on certain DP1 phases of the clock cycle. Occurrences of DP2 without a prior LD have no effect on the state of the device. Once the LD occurs, latch L1 latches the value at node 13, which is 1 after reset. At the same time, LDA will be 1 since LDA=LD when node 13=1. The next DP2 will cause the value of nodes 12 and 13 to change; thus node 13=0. The next LD will generate an LDB=1 since LDB=LD when node 13=0. Therefore, at every LD signal, either an LDA or an LDB is generated.

Figure 9:
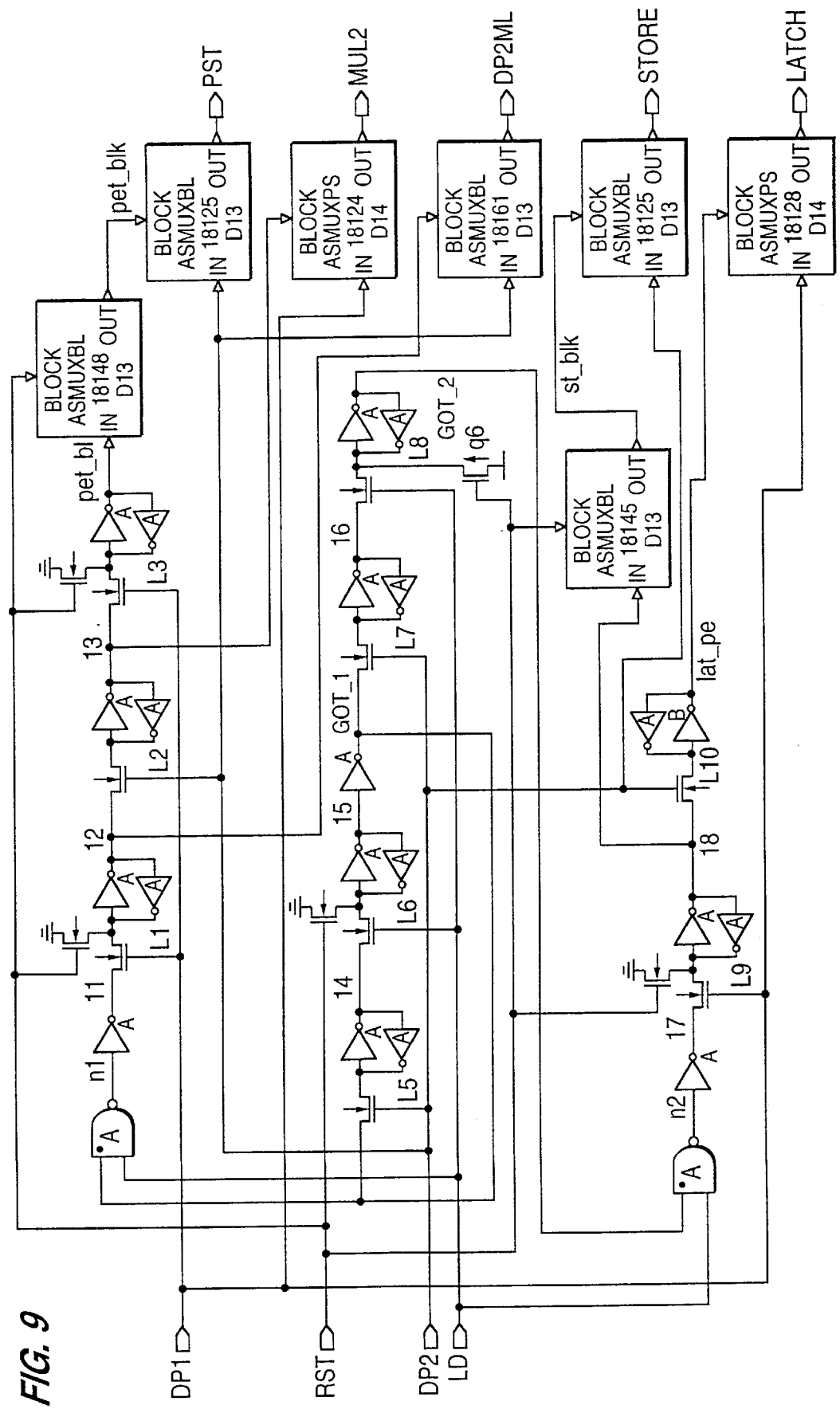
FIG. 9 is a block diagram of another type of decimation controller used in FIG. 6.

FIG. 9 is a block diagram of the second type of decimation stage used in FIG. 6 and shown as 607-1 to 607-5. The circuit in FIG. 9 implements the $(1+z^{-1})*(1+z^{-1})$ decimation function of Stage 3 through Stage 7. DP1 and DP2 are non-overlapping clocks and LD is a conditional DP1 signal. Thus, LD and DP2 are non-overlapping clock signals. RST is an asynchronous reset signal that externally forces LD to 0 and DP2 to 1.

The output of the block are signals PST, MUL2, DP2ML, STORE and LATCH. The input signals to the block are DP1, DP2, LD and RST. Initially, RST will generate the reset action. When RST is set to 1, the reset signal forces DP2 to 1 and LD to 0. This results in node 11=0, node 12=1, node 13=0, PST_BL=1 and PST_BLK=0. The RSMUXBL blocks function such that: if BLOCK=1 then OUT=0 and if BLOCK=0 then OUT=IN. The RSMUXPS blocks function such that: if PASS=0 then OUT=0 and if PASS=1 then OUT=IN. Thus, at reset, PST=1, MUL2=0, DP2ML=0, STORE=1 and LATCH=0. Also, nodes GOT_1 and GOT_2 are 0 at reset.

The devices progress with the occurrence of an LD signal. LD occurs on certain DP1 phases of the clock cycle, whereas DP2 occurs at every clock cycle. As the LD occurs, it sets GOT_1 to 1 while GOT_2 remains 0. The next LD will reset GOT_1 to 0 and set GOT_2 to 1. Thus, the device operates with either GOT_1 or GOT_2 set to 1.

When node 14=1, the first subsequent LD signal will make node 11=1 and node 12=0. Thus, the next DP2 will generate a DP2ML and will also result in node 13=1 and node 16=0. The next DP1 will generate a MUL2. The next DP2 will consequently generate a PST=1. The next set of DP1 and DP2 clocks will have no effect on the state of the device. The next set of events will occur with the arrival a second subsequent LD signal. As this LD occurs, node 18=0. The next DP2 will generate a STORE and the DP1 after that will generate a LATCH. The next LD signal will make node 11=1 and node 12=0, thus repeating the cycle of events described within this paragraph.

What is claimed is:

1. A decimator comprising:

a first stage receiving a first data stream at a first rate, adding a current sample of the first data stream to a previous sample of the first data stream to create a second data stream at a second data rate slower than the first data rate;

a second stage receiving the second data stream from the first stage, adding a current sample of the second data stream to a previous sample of the second data stream to create a third data stream at a third data rate slower than the second data rate; and a third stage having an adder and a memory, the third stage receiving the third data stream from the second stage, forming a partial sample based on sample data of the third data stream for storage in the memory at a sample time and at a next sample time, and forming a sum of a current sample of the third data stream and the partial sample to create a fourth data stream at a fourth data rate slower than the third data rate.

2. The decimator according to claim 1 further comprising an input port connected to receive the first data stream as an input data stream, and to output the first data stream to the first stage.

3. The decimator according to claim 1, wherein the first data rate is twice the second data rate, the second data rate is twice the third data rate, and the third data rate is twice the fourth data rate.

4. The decimator according to claim 1, further comprising a fourth stage having an adder and a memory, the fourth stage receiving the fourth data stream from the third stage, forming a second partial sample based on sample data of the fourth data stream for storage in the memory at the sample time and at the next sample time, and forming a sum of a current sample of the fourth data stream and the second partial sample to create a fifth data stream at a fifth data rate slower than the fourth data rate.

5. The decimator according to claim 1, wherein the first and second stages have respective transfer functions according to $1+z^{-1}$, and wherein the third stage has a transfer function according to $(1+z^{-1})*(1+z^{-1})$.

* * * * *